(12) United States Patent
Sakamaki

(10) Patent No.: US 11,092,651 B2
(45) Date of Patent: Aug. 17, 2021

(54) HIGH-FREQUENCY PROBE POSITION CORRECTION TECHNOLOGY

(71) Applicant: National Institute of Advanced Industrial Science and Technology, Tokyo (JP)

(72) Inventor: Ryo Sakamaki, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 340 days.

(21) Appl. No.: 16/304,895

(22) PCT Filed: Apr. 12, 2017

(86) PCT No.: PCT/JP2017/014970
§ 371 (c)(1),
(2) Date: Nov. 27, 2018

(87) PCT Pub. No.: WO2017/203876
PCT Pub. Date: Nov. 30, 2017

(65) Prior Publication Data
US 2020/0124669 A1    Apr. 23, 2020

(30) Foreign Application Priority Data

May 27, 2016 (JP) .............................. JP2016-106192
Sep. 28, 2016 (JP) .............................. JP2016-189277

(51) Int. Cl.
*G01R 1/073* (2006.01)
*G01R 31/00* (2006.01)
(Continued)

(52) U.S. Cl.
CPC ..... *G01R 31/3191* (2013.01); *G01R 31/2822* (2013.01); *G01R 31/2886* (2013.01)

(58) Field of Classification Search
CPC ............ G01R 31/2822; G01R 31/2886; G01R 31/3191; G01R 27/28; G01R 27/32; G01R 35/00
See application file for complete search history.

(56) References Cited

U.S. PATENT DOCUMENTS 6,002,263 A     12/1999  Peters et al.
7,805,265 B2 *   9/2010  Namba ................. G01R 27/28
                                              702/65
(Continued)

FOREIGN PATENT DOCUMENTS

JP         H08-288342 A      11/1996
JP         H11-26526 A        1/1999
(Continued)

OTHER PUBLICATIONS

International Search Report issued in PCT/JP2017/014970 dated Jun. 27, 2017 (5 pages).
(Continued)

*Primary Examiner* — Minh N Tang
(74) *Attorney, Agent, or Firm* — Osha Bergman Watanabe & Burton LLP

(57) ABSTRACT

A high-frequency characteristic inspection apparatus includes a pair of high-frequency probes that inspect an electrical characteristic of a plane circuit including a signal region and a ground region formed apart from each other by an S parameter obtained by pushing a tip against a surface of the plane circuit and discharging a high frequency and a measurement apparatus. The high-frequency probe includes a ground terminal that is in contact with the ground region at its tip and a signal terminal that is in contact with the signal region simultaneously with the ground terminal at its tip. The pair of high-frequency probes are configured to
(Continued)

contact with a surface of the plane circuit at the same time while facing each other at a certain interval.

18 Claims, 14 Drawing Sheets

(51) Int. Cl.
  *G01R 31/319* (2006.01)
  *G01R 31/28* (2006.01)

(56) References Cited

U.S. PATENT DOCUMENTS

| | | | | |
|---|---|---|---|---|
| 7,994,801 | B2* | 8/2011 | Hagerup | G01R 27/32 |
| | | | | 324/601 |
| 8,552,742 | B2* | 10/2013 | Huang | H04B 3/46 |
| | | | | 324/638 |
| 2005/0091015 | A1 | 4/2005 | Adamian | |
| 2008/0036469 | A1 | 2/2008 | Chladek et al. | |
| 2010/0001742 | A1* | 1/2010 | Strid | G01R 35/005 |
| | | | | 324/601 |
| 2011/0208467 | A1* | 8/2011 | Tang | G01R 35/007 |
| | | | | 702/117 |
| 2014/0167794 | A1* | 6/2014 | Nath | G01R 35/007 |
| | | | | 324/750.02 |

FOREIGN PATENT DOCUMENTS

| | | |
|---|---|---|
| JP | 2002-357630 A | 12/2002 |
| JP | 2005-134399 A | 5/2005 |
| JP | 2010-281639 A | 12/2010 |
| WO | 2004/036150 A2 | 4/2004 |

OTHER PUBLICATIONS

Written Opinion of the International Searching Authority issued in PCT/JP2017/014970 dated Jun. 27, 2017 (3 pages).

Cascade Microtech, Inc.; "Innovating Test Technologies for Better Measurements Faster"; RF Sokutei Guide; Feb. 2010 (57 pages).

Sakamaki Ryo et al., "Uncertainty factors and their influences in On-Wafer measurement at Millimeter-wave Frequency Band"; Preliminary Proceedings of Spring Seminar of the Institute of Electrical and Information Communications 2016, C-2-83 (1 page).

* cited by examiner

FIG. 6
(a)
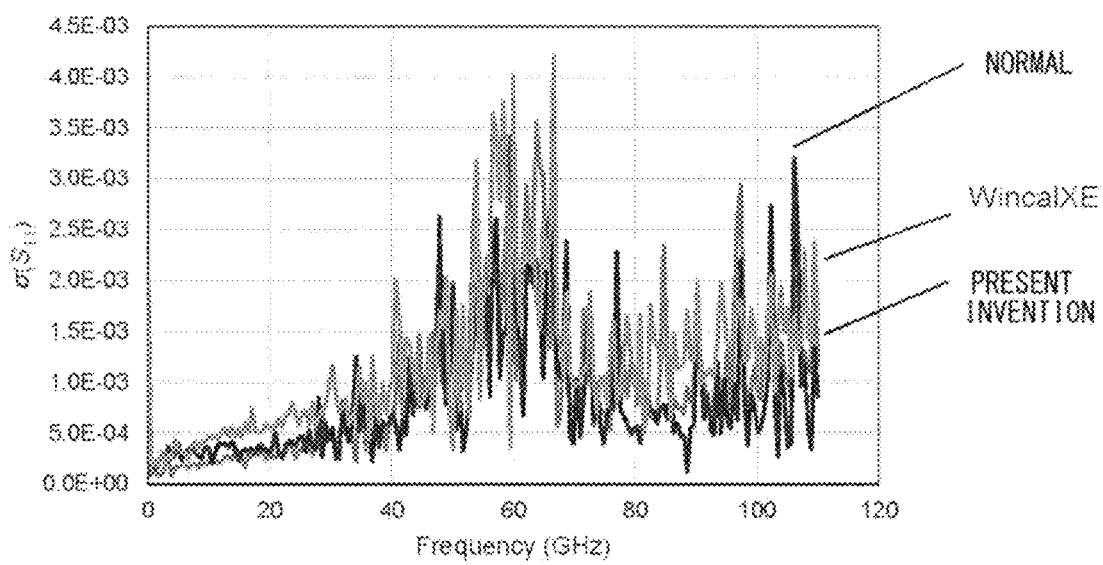
(b)
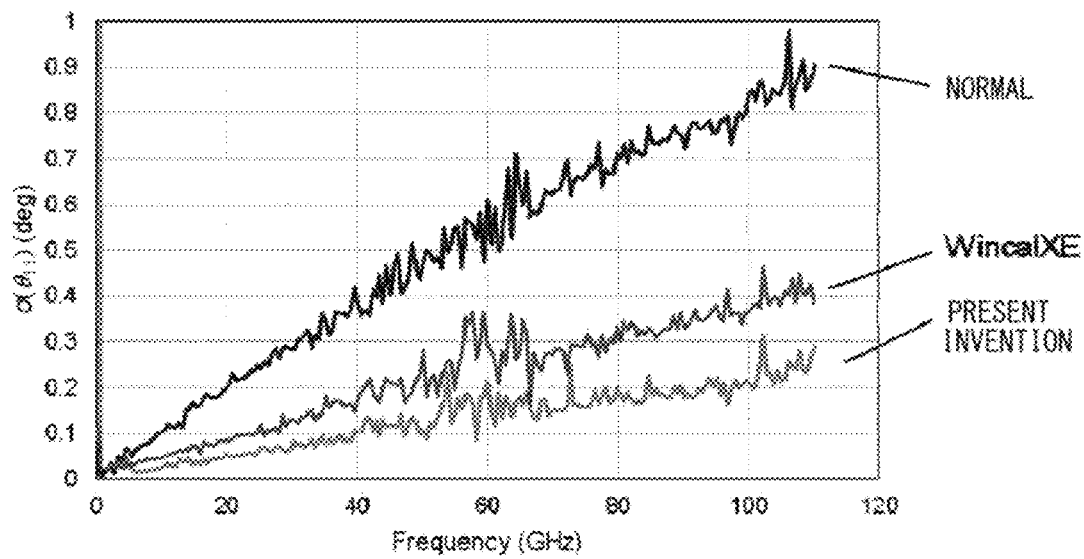

FIG. 8

DEVELOPED PROBE POSITION DETERMINED METHOD

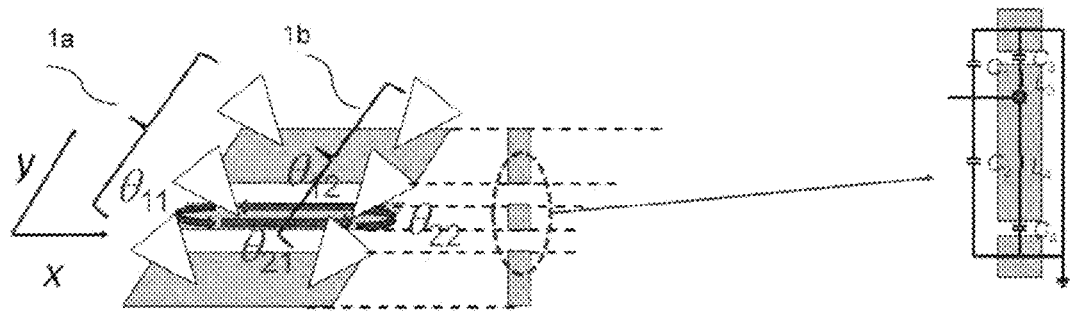

- AT CENTER IN X DIRECTION, $\theta_{11} = \theta_{22}$
- AT CENTER IN Y DIRECTION, BALANCE ($C_1 = C_2, L_3 = L_4$) $\theta_{12}, \theta_{21}$ IS EXTREME VALUE
- CONTACT POSITION IS DETERMINED BY USING FACT THAT REFLECTION COEFFICIENT DECREASES WHEN CONTACTING IN Z DIRECTION

FIG. 9

FEEDBACK MEASURED VALUE TO OPTIMIZE PROBE POSITION

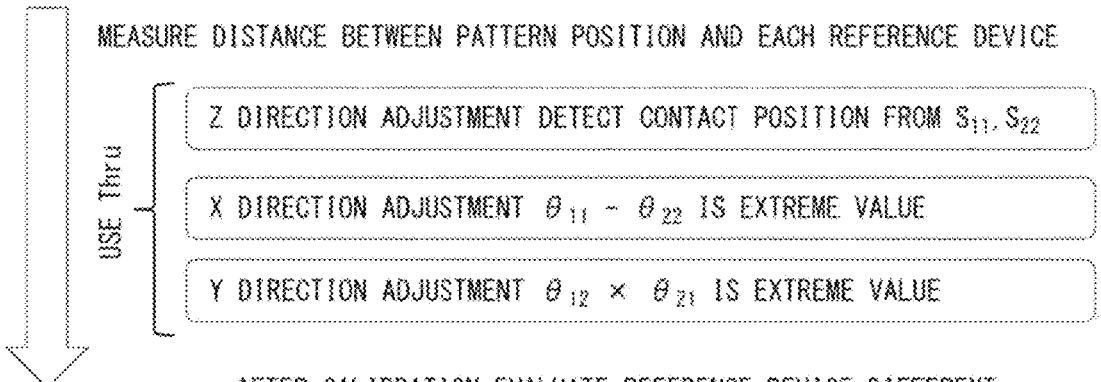

MEASURE DISTANCE BETWEEN PATTERN POSITION AND EACH REFERENCE DEVICE

USE Thru:
- Z DIRECTION ADJUSTMENT DETECT CONTACT POSITION FROM $S_{11}, S_{22}$
- X DIRECTION ADJUSTMENT $\theta_{11} - \theta_{22}$ IS EXTREME VALUE
- Y DIRECTION ADJUSTMENT $\theta_{12} \times \theta_{21}$ IS EXTREME VALUE AFTER CALIBRATION, EVALUATE REFERENCE DEVICE DIFFERENT FROM THAT AT THE TIME OF CALIBRATION

--PRIOR ART--

--PRIOR ART--

HIGH-FREQUENCY PROBE POSITION CORRECTION TECHNOLOGY

FIELD

The present invention relates to a position correction for calibrating an electrical midpoint of a sample in a high-frequency characteristic inspection apparatus having a high-frequency probe for conducting a certain electrical inspection.

BACKGROUND

The high-frequency characteristic inspection apparatus is used for an evaluation of a plane circuit in a millimeter-wave band.

For the high-frequency characteristic inspection apparatus used in a high-frequency inspection such as a high-frequency impedance measurement or the like, as a measurement member, a high-frequency probe (S-G type or G-S type) in which a signal terminal (S) for inputting a measurement signal to a DUT (device under test, network to be measured) or outputting the measurement signal from the DUT and a grounded terminal (G) are spaced apart from each other and arranged in parallel at a tip of the apparatus, a high-frequency probe (G-S-G type) in which two ground terminals (G, G) are spaced apart from each other so as to sandwich the signal terminal (S) and arranged in parallel at the tip of the apparatus and the like are used (PTL 3).

The high-frequency characteristic inspection apparatus is configured from, as illustrated in FIG. 13, in general, a movable stage having a horizontal surface on which a DUT is placed and which can be moved to X, Y, and Z axes, a pair of opposed high-frequency probes which contact with the placed DUT and measure electrical characteristics, a probe attach unit capable of fixing the pair of high-frequency probes to the device at a certain interval, a frequency extension unit for generating high frequency for DUT measurement, and a vector network analyzer (VNA) that controls a system and measures and analyzes reflected wave/transmitted wave from DUT (PTL 1, PTL 2).

Before conducting the certain electrical inspection of the DUT using the high-frequency probe, it is general to conduct the calibration for measuring and evaluating the device-specific error included in an inspection value.

It is general to conduct the calibration after the certain reference pattern for inspection is prepared, for example, the adjustment in the Z axis direction is conducted using the reference device illustrated in FIG. 14 (probe pressing amount), by moving to the certain reference device (for example, THRU, SHORT, LOAD reference devices), the probe is moved in parallel by the visual observation by the predetermined amount (FIG. 12, Comparative Example 1), the PC control, or the like (FIG. 12, Comparative Example 2), and the XY position of the high-frequency probe is determined.

The adjustment in the Z axis direction is conducted as illustrated in FIG. 14 such that the center of a GSG probe fits to a position A, the probe is pushed so that the tip of the probe slides from the position B to the position C and the position of the Z-axis is adjusted.

Similarly for the other opposing tip of the probe, the position of the Z-axis is adjusted, a pair of opposing high-frequency probes is prepared and the calibration by the reference pattern is conducted.

However, in the conventional method, the measurement for the calibration includes a variation in a contact position between the high-frequency probe and the inspection pattern of DUT, the variation in the pressing amount, and an influence of an electromagnetic field spreading in space, each measurement work dependence is high, and accordingly, there has been a problem with a reliability of the measurement result and the reproducibility of the measurement by the high-frequency probe undergoing the calibration at a position determined by a conventional method.

CITATION LIST

Patent Literature

[PTL 1] Japanese Unexamined Patent Publication (Kokai) No. 8-288342
[PTL 2] Japanese Unexamined Patent Publication (Kokai) No. 11-26526
[PTL 3] Japanese Unexamined Patent Publication (Kokai) No. 2002-357630

Non Patent Literature

[NPL 1] WinCalXE™ calibration software (https://www.cascademicrotech.com/jp/products/wincal/wincalxe)
[NPL 2] Sakamaki Ryo, Horibe Masahiro, Preliminary Proceedings of Spring Seminar of the Institute of Electrical and Information Communications 2016, C-2-83
[NPL 3] Cascade Microtech Inc. impedance reference board 101-190 open drawing, http://www.cmicro.com/files/iss_map_101-190.pdf

SUMMARY

Technical Problem

Table 1 (reprinting Table 1 of NPL 2) represents an analysis result (evaluation result of uncertainty of reflectivity coefficient) of the degree of the influence of error factors such as variations in the contact position with the plane circuit of the high-frequency probe by the conventional method on the measurement result.

TABLE 1

Evaluation result of uncertainty of reflectivity coefficient (100 GHZ)

| uncertainty factor | instability due to environmental conditions | uncertainty |
| --- | --- | --- |
| probe position X direction | 10 μm | $8.6 * 10^{-3}$ |
| probe position Y direction | 10 μm | $2.9 * 10^{-3}$ |
| skate amount Z direction | 10 μm | $7.8 * 10^{-3}$ |
| ambient temperature | 0.1 degree | $1.8 * 10^{-3}$ |
| probe reproducibility | | $4.2 * 10^{-4}$ |
| measurement repeatability | | $3.0 * 10^{-4}$ |
| measurement resolution | | $5.8 * 10^{-7}$ |

As is evident from the uncertainty item in Table 1, the table indicates that the determination of the probe position (X direction, Y direction, and Z direction) is the main factor in the influence degree.

Looking at the instability item according to the environmental condition in Table 1, a control accuracy of the probe position by a microscope technique of the plane circuit is at most about 10 μm, which is close to a limit of a microscope resolution when using a stereoscopic microscope.

Therefore, a method of controlling the probe position exceeding the limit has been desired.

Solution to Problem

Regardless of the microscope technique, the present invention can provide the means in which the high-frequency probe is moved along the X, Y, and Z axes while feeding back the measurement value of an S parameter measured by discharging the high frequency from the position of tentative of the plane circuit, the optimum probe position for the electrical measurement is searched and the reference position is determined.

In general, it is known that the fine movement accuracy (about 0.1 to 1 µm) of the probe is higher than the resolution (about 10 µm at the most) when a stereoscopic microscope is used.

For example, simply by changing the probe position by 1 µm, the sensitivity of the measure instrument is changed to $(10^{-7})$ or more.

Analyzing the reflection characteristic value (reflection/transmission coefficient and phase characteristics) obtained by the certain method, it is found that the measurement value becomes an extreme value at the electrical center position.

The present invention, as illustrated in FIG. 1, can provide the means in which the feedback measurement value of the S parameter measured by discharging the high frequency while slightly moving the probe position in the Z direction, the X direction, and the Y direction with respect to the certain reference device of the plane circuit is obtained, the feedback measurement value is analyzed to determine the probe position in each direction, and the probe position to be the electrical center position of the plane circuit is determined with an accuracy of 2 µm or less.

By the reference alignment of the present invention, the calibration according to the ideal calibration theory that it is electrically symmetric with respect to each port of the measurement apparatus (VNA) to which a pair of facing high-frequency probes are connected becomes possible.

The measurement errors due to the probe position according to the present invention is $2*10^{-3}$ (square sum of squares in X direction, Y direction, and Z direction), and it is found that the error is improved by a single digit from the value $(1.2*10^{-2})$ calculated from Table 1 of NPL 2.

Advantageous Effects of Invention

Without depending on the resolution of the microscope and the work ability of a person, the influence of the flatness and the alignment of the movable stage and the device (DUT) is eliminated, the probe position can be determined with the accuracy of 2 µm or less, and it becomes possible to suppress the variation in the measurement when the plane circuit is evaluated.

In the present invention, to obtain the electrical neutral point between the S terminals (port) in the measurement, it is possible to realize the calibration consistent with the calibration theory.

BRIEF DESCRIPTION OF DRAWINGS

FIG. 6 is a graph illustrating a result obtained by evaluating the SHORT reference device of Example 1. FIG. 6(a) is a graph illustrating an $S_{11}$ reflection characteristic and FIG. 6(b) is a graph illustrating the phase characteristics thereof.

FIG. 7(a) is a graph illustrating an $S_{11}$ reflection characteristic, FIG. 7(b) is a graph illustrating the phase characteristics thereof, FIG. 7(c) is a graph illustrating the transmission characteristics, and FIG. 7(d) is a graph illustrating the phase characteristics thereof.

FIG. 8 is a principle diagram of Example 1.

FIG. 9 is a schematic diagram illustrating a position determination method of Example 1.

DESCRIPTION OF EMBODIMENTS

Example 1

(Position Determination using THRU Reference Device)

Figure 1:
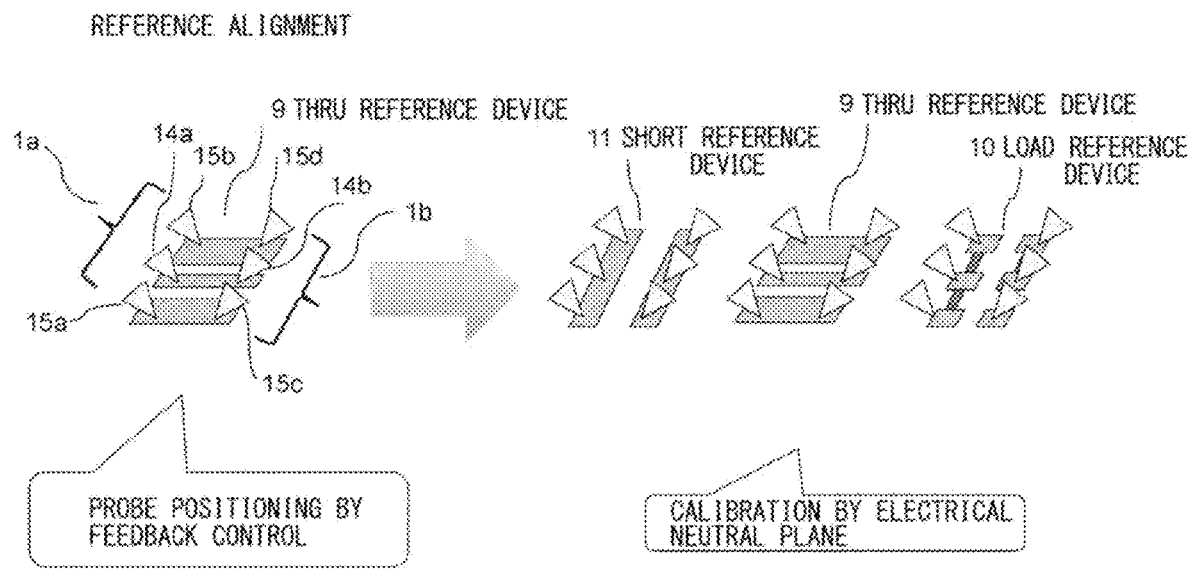
FIG. 1 is a drawing illustrating an aspect of an example of the present invention.
Figure 2:
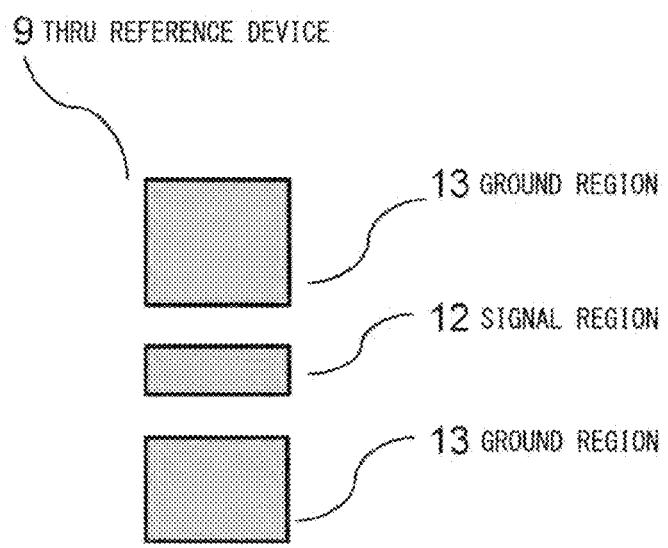
FIG. 2 is a drawing illustrating s shape example of a THRU reference device.

FIG. 2 illustrates the shape example of the THRU reference device used in the present Examples.

Figure 3:
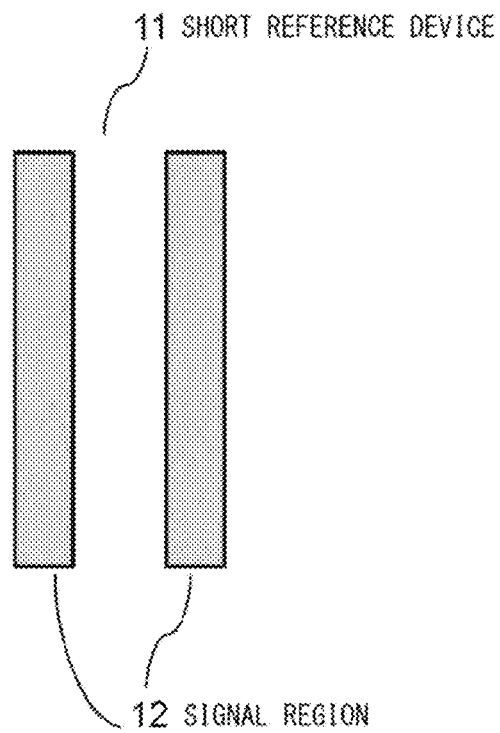
FIG. 3 is a drawing illustrating a shape example of a SHORT reference device.
Figure 4:
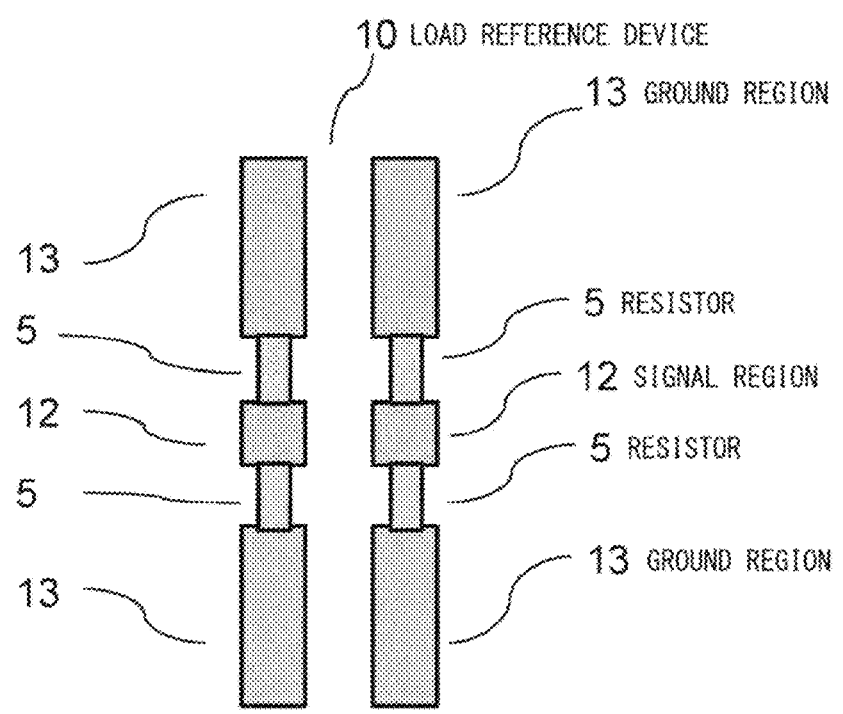
FIG. 4 is a drawing illustrating a shape example of a LOAD reference device.

The THRU reference device is the test specimen that is used for the THRU test measurement and has the same size and the shape as a part of the device under the test to be used in advance for positioning when the device under the test such as the plane circuit is measured, and in general, is a part of the sample in which other patterns such as the SHORT reference device illustrated in FIG. 3 and the LOAD reference device illustrated in FIG. 4 are arranged together.

More specifically, the THRU reference device is the reference device for connecting between the signals and between the grounds of the pair of probes and is a pattern in which a signal region to which the signal terminal is directly connected is located at the center and the spaced and isolated ground regions to which the ground terminal is directly connected is placed at the both sides of the signal area.

The LOAD reference device is the reference device that realizes characteristics close to the non-reflection by arranging the resistor equal to the characteristic impedance between the signal of each probe and the ground terminal.

The SHORT reference device is a reference device that is almost total reflection in which the signal of each probe and the ground terminal are short-circuited.

Figure 10:
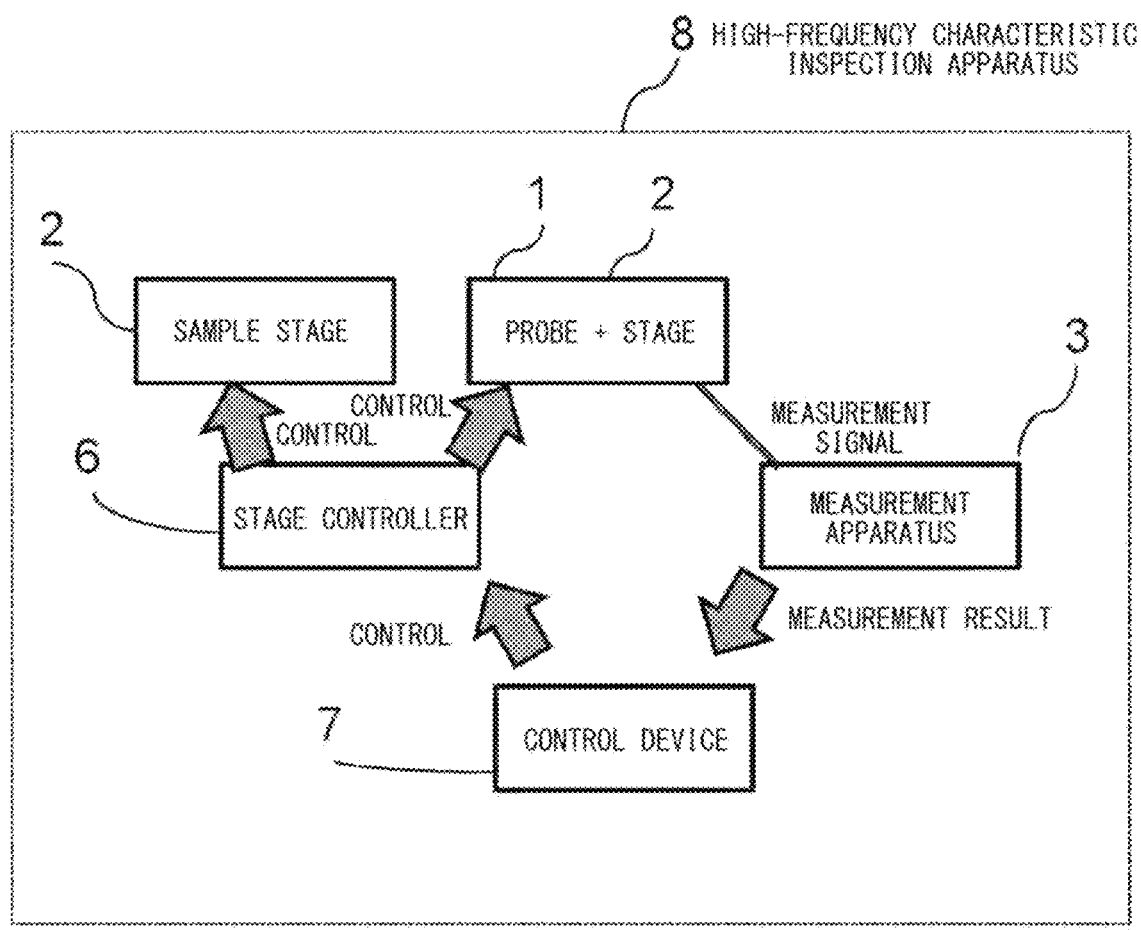
FIG. 10 is a schematic diagram of a system.
Figure 11:
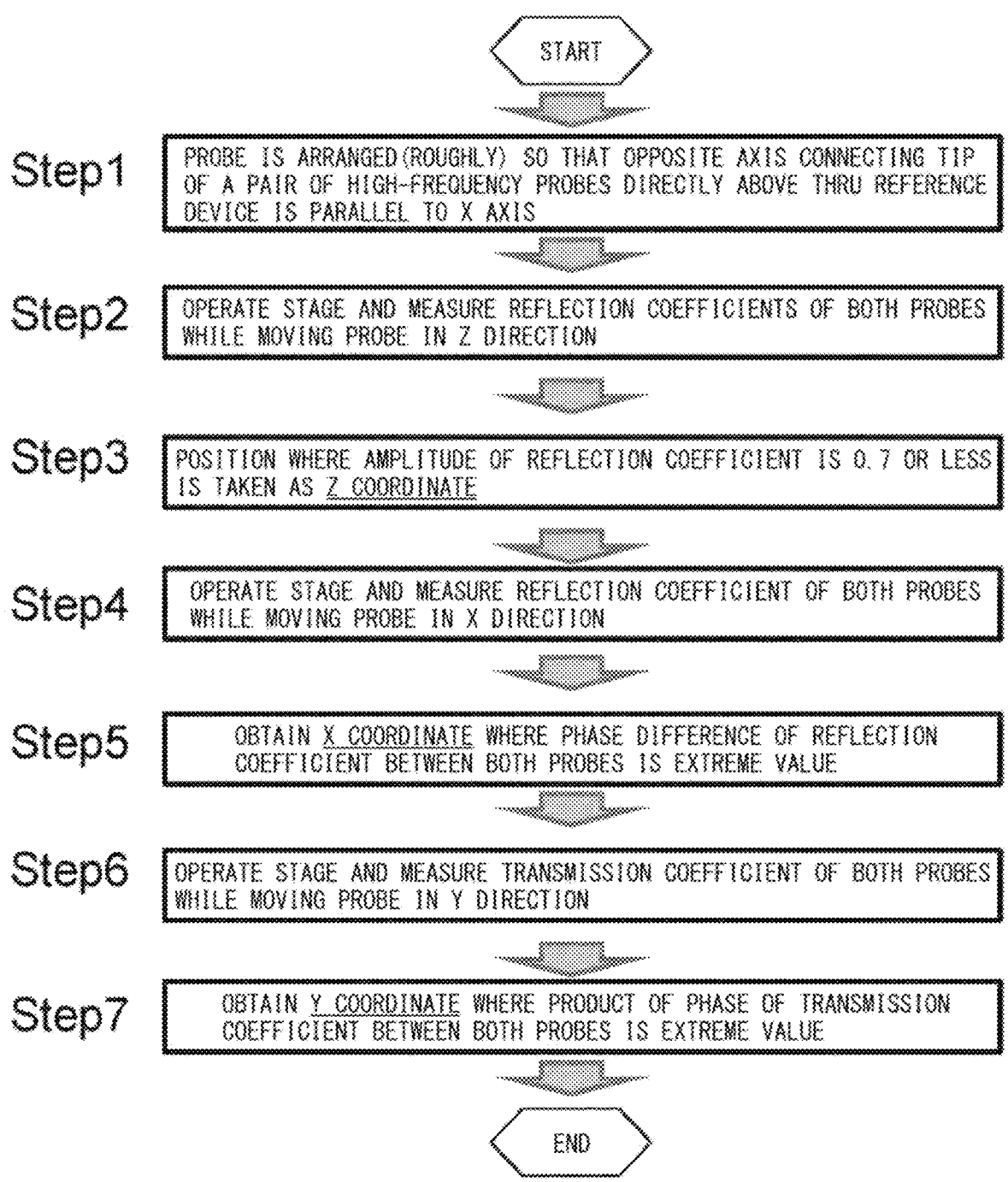
FIG. 11 is a flowchart illustrating a control process.
Figure 12:
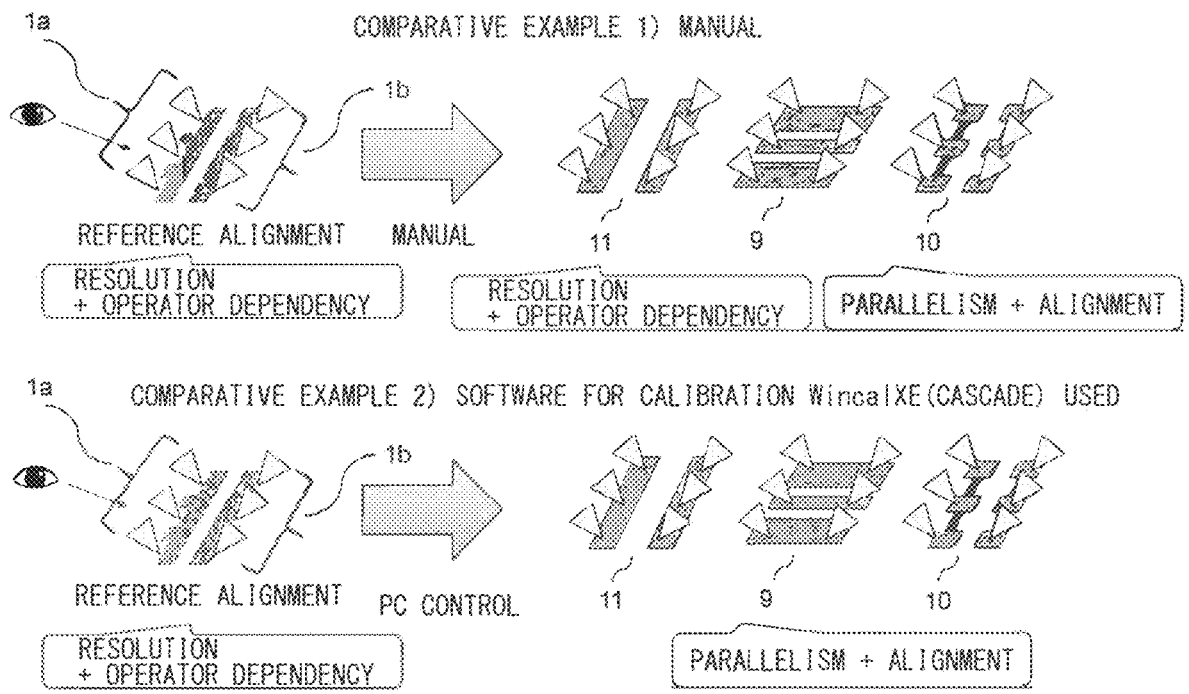
FIG. 12 is a drawing illustrating a conventional determination method of the probe position.
Figure 13:
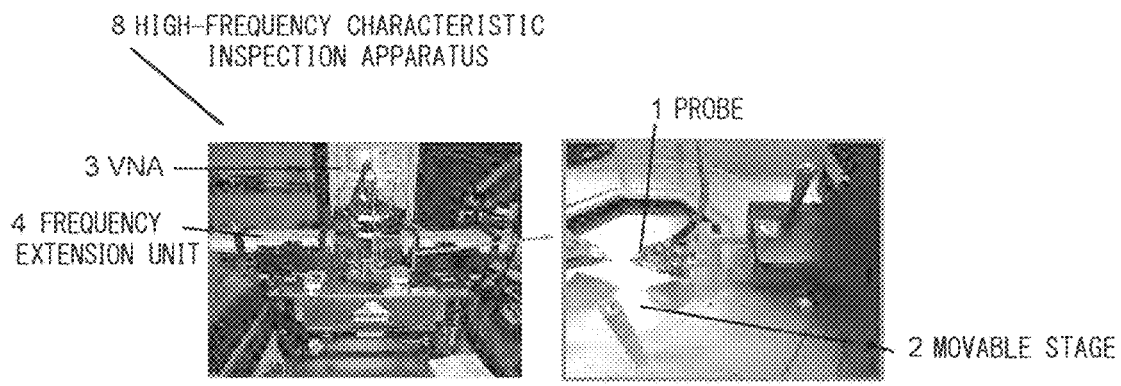
FIG. 13 is a drawing illustrating a schematic configuration of a high-frequency characteristic inspection apparatus used in the present invention.
Figure 14:
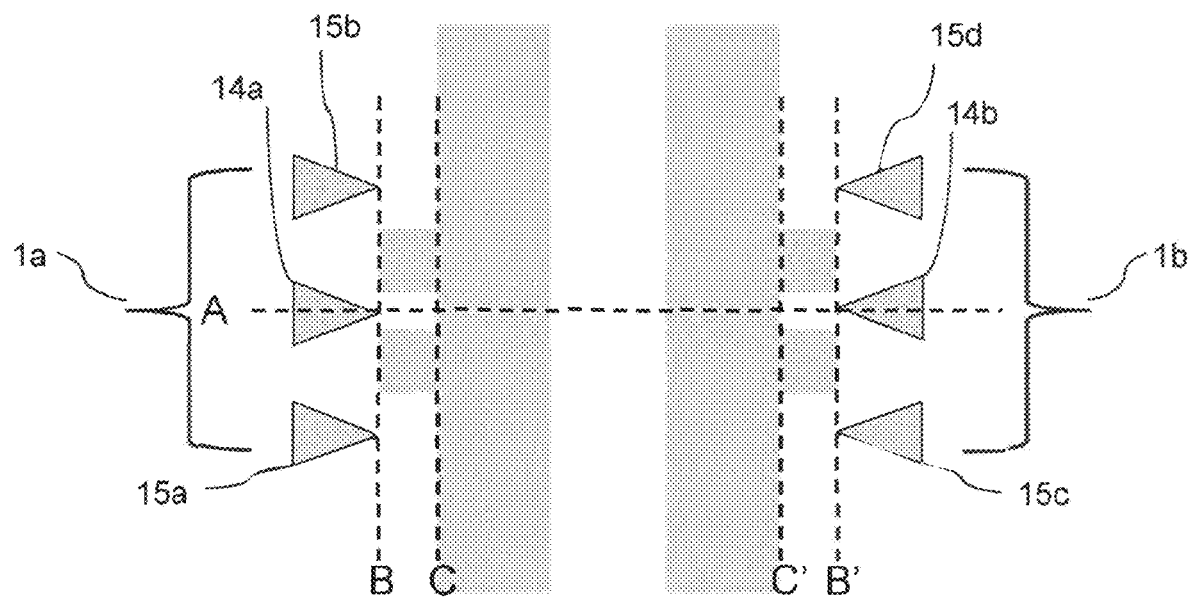
FIG. 14 is a drawing illustrating a conventional determination method of the Z-axis of the probe position.

FIG. 13 is a photographic image obtained by capturing an image of the high-frequency characteristic inspection apparatus used in the present invention and FIG. 10 is a system configuration diagram in which the contents of the apparatus are simplified (Cascade ISS: 101-109 as a sample calibration standard, Cascade's Summit 12000 as a movable stage, GSG-Infinity-150 pitch (registered trademark) of the company as a probe, and E8361 A of Keysight, Inc. as a VNA were used. The personal computers used as control devices are not included).

With the simplified system of the configuration of FIG. 10, the method of determining the probe position on the sample placed on the movable stage using the THRU reference device illustrated in FIG. 2 is explained below.

In the present invention, when referring to the X, Y, Z positions, a place where a pair of facing high-frequency probes are arranged is indicated, and when referring to the X, Y, Z coordinates, each distance from the certain origin of the device to the midpoint between opposing probe tips may be determined, the distance to the tip of one pair of the opposed probe may be determined, or the position of tentative and the distance with the center of the plane of the movable stage as the origin may be determined as appropriate.

First, as illustrated in FIG. 8, a pair of facing high-frequency probes at a certain interval is arranged immediately above the THRU reference device placed on the sample stage such that the opposing axis connecting the tip of the pair of high-frequency probe is parallel to the X axis.

For this purpose, the high-frequency characteristic inspection apparatus may have a stage rotate mechanism for rotating the movable stage on which the sample is placed.

At this time, although the position where the probe is arranged immediately above may be the rough position, it is desirable to determine the position of tentative such that the tip of a pair of opposing high-frequency probes is in contact with the signal region of the THRU reference device on the movable stage and can be moved in the X and Y directions.

Thereafter, in response to the instruction from control device, the sample stage is raised little by little along the Z-axis via the stage controller so as to approach the sample stage to the sample.

In the present example, as the control device in FIG. 10, the personal computer is used to calculate the Z-axis movement amount, and the Z-axis movement amount is input to the stage controller.

While raising the sample stage, the reflectivity coefficients $S_{11}$, $S_{22}$ at both probes are read via the measurement device.

When the sample contacts with one side of the probe, the reflectivity coefficient ($S_{11}$, $S_{22}$) is largely reduced.

For example, if the reflectivity coefficient is set to 0.7 or less or the phase is set to 90 to 180 degrees, the determination as to presence or absence of the contact of a pair of probes is possible.

Hereinafter, when the contacts of both probes are detected, the positional relationship between the sample stage and the tip of the probe is determined as the Z position (contact position) (not illustrated).

The sample stage is operated, and next the measurement is conducted while moving a pair of opposed probes by the certain distance in the X direction.

The movement amount measures the reflectivity coefficient of the both probes at each position while moving by 1 μm in a range of ±10 μm, for example.

The probe position at which the difference $|\theta_{11}-\theta_{22}|$ between the phase components $\theta_{11}$, $\theta_{22}$ of the reflectivity coefficients $S_{11}$, $S_{22}$ between the both probes is the extreme value is determined as the X position.

Preferably, it is a position where the difference is zero in the same phase, i.e., $\theta_{11}=\theta_{22}$.

Further, the sample stage is operated, and the measurement is conducted while moving a pair of opposed probes by the certain distance in the Y direction. The movement amount measures the transmission coefficients $S_{12}$ and $S_{21}$ of both probes at each position while moving by 2 μm in the range of ±10 μm, for example.

The probe position at which the product $\theta_{12} \times \theta_{21}$ of the phase components $\theta_{12}$, $\theta_{21}$ of the transmission coefficients $S_{12}$, $S_{21}$ between the both probes is the extreme value is determined as the Y position.

In this case, in the equivalent circuit illustrated in the right side of FIG. 8, the position where the inductances $L_1$, $L_2$, $L_3$, $L_4$ are balanced is the center between a pair of opposed probes and this point is the electrical center.

The thus determined X, Y, Z positions become reference positions of the probe in the sample, and the analysis value of the S parameter at this position can be set as the calibration value.

When the X and Y direction position is determined, by pushing the probe in the Z direction by the predetermined amount from the contact position, the position of the tip of a pair of probes is marked and the evaluation with the high reproducibility is possible.

In this way, it is possible to precisely determine the probe position in the X, Y, and Z axis directions with the high reproducibility.

When other reference devices on sample are calibrated, the distance between the SHORT and the LOAD reference devices with respect to the THRU reference device on the sample is measured in advance, and the position of the probe is moved from the THRU reference device by that amount so that the calibration with the high reproducibility can be realized.

Figure 5:
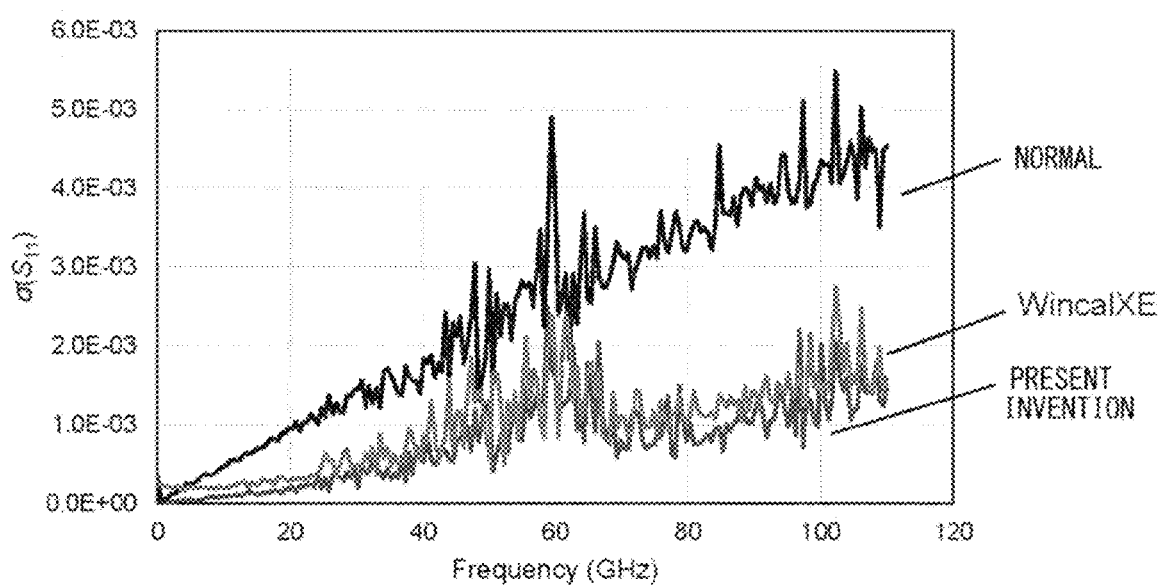
FIG. 5 is a drawing illustrating a result obtained by evaluating an $S_{11}$ reflection characteristic of the LOAD reference device in Example 1.
Figure 7:
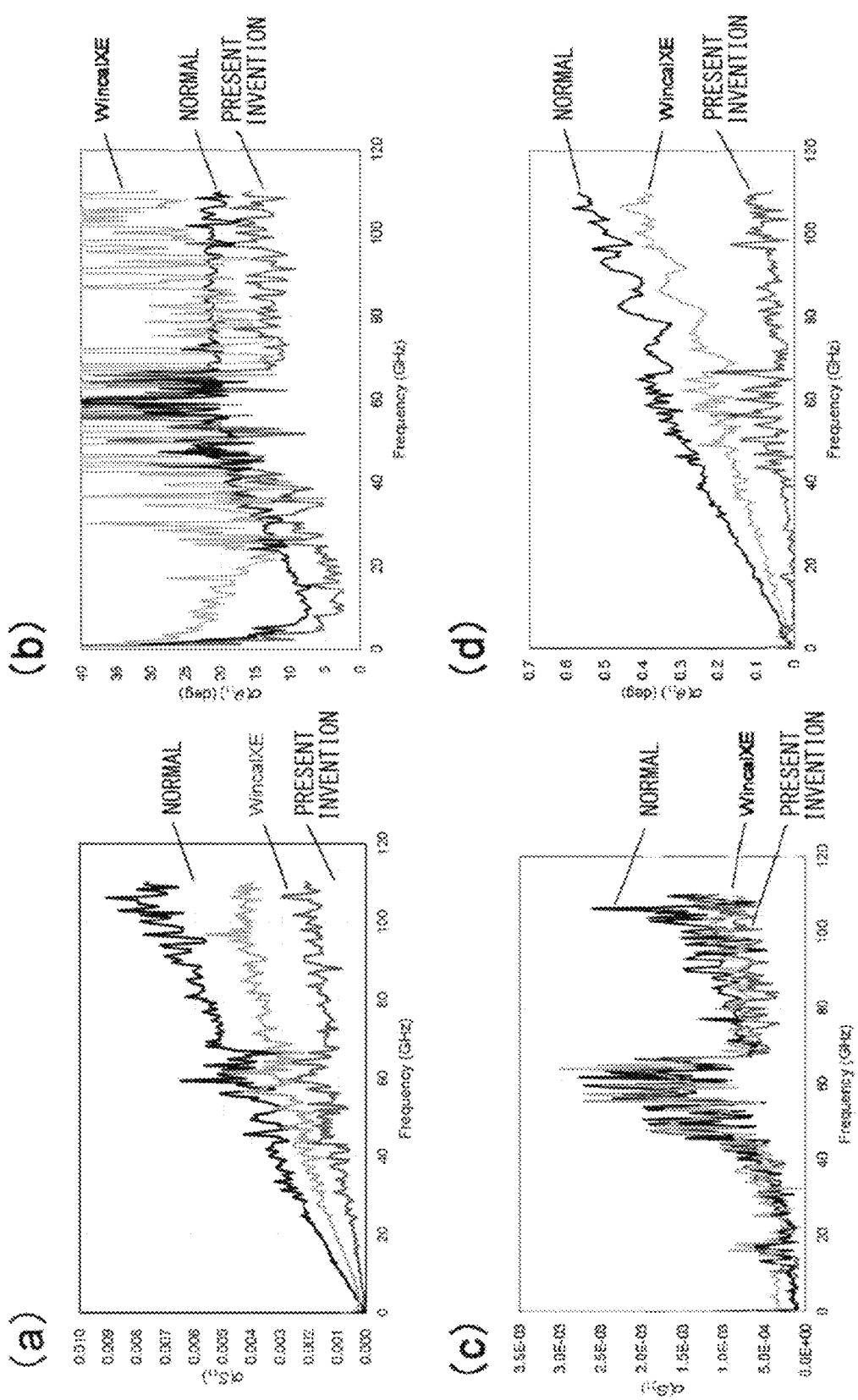
FIG. 7 is a graph illustrating a result obtained by evaluating the THRU reference device of Example 1.

FIG. 5 to FIG. 7 illustrate examples in which the THRU reference device, the SHORT reference device, and the LOAD reference device which are different from those at the time of calibration are evaluated after the calibration of the present invention and the standard deviation of the result of the comparative example in which the calibration is conducted based on the conventional method and then, the different reference device from the calibration is evaluated.

FIG. 5 illustrates the standard deviation of the amplitude of the $S_{11}$ coefficient in the LOAD reference device, FIG. 6 illustrates the amplitude of the $S_{11}$ coefficient and the standard deviation of the phase components $\theta_{11}$ in the SHORT reference device, and FIG. 7 illustrates the amplitude of the $S_{11}$, $S_{21}$ coefficients and the standard deviation of the phase components $\theta_{11}$, $\theta_{21}$ in the THRU reference device.

The reference numeral "normal" in each drawing represents Comparative Example 1 of the evaluation after the calibration conducted manually by the conventional method, and the reference numeral "WincalXE" in each drawing represents Comparative Example 2 of the evaluation in which the probe position is controlled by the calibration software that operates on the PC after the calibration based on the manual reference alignment.

In the comparative example, since the reference alignment is a geometric neutral plane, it is difficult to say that it is an ideal calibration theory, but the reference alignment of the present invention realizes the ideal calibration that it is electrically symmetric with respect to each port of the measurement apparatus (VNA) to which a pair of facing high-frequency probes is connected.

Viewing the amplitude of the LOAD reflectivity coefficient $S_{11}$ in FIG. 5, the phase of the SHORT reflectivity coefficient $S_{11}$ in FIG. 6, and the amplitude of the THRU reflectivity coefficient $S_{11}$ and the phase of the transmission coefficients $S_{21}$ in FIG. 7, it is found in each drawing that the standard deviation of the Example is smaller than that of the Comparative Example.

In this way, by using this technology, the calibration with the high accuracy can be realized.

Example 2

In the present Example, the X axis direction is the method of determining the reference position different from that of Example 1, and the determination method of the contact position of the Z axis direction and the determination method of the electrical center position of the Y axis direction in Example 1 are added so that X, Y and Z coordinates can be determined with high accuracy.

Figure 15:
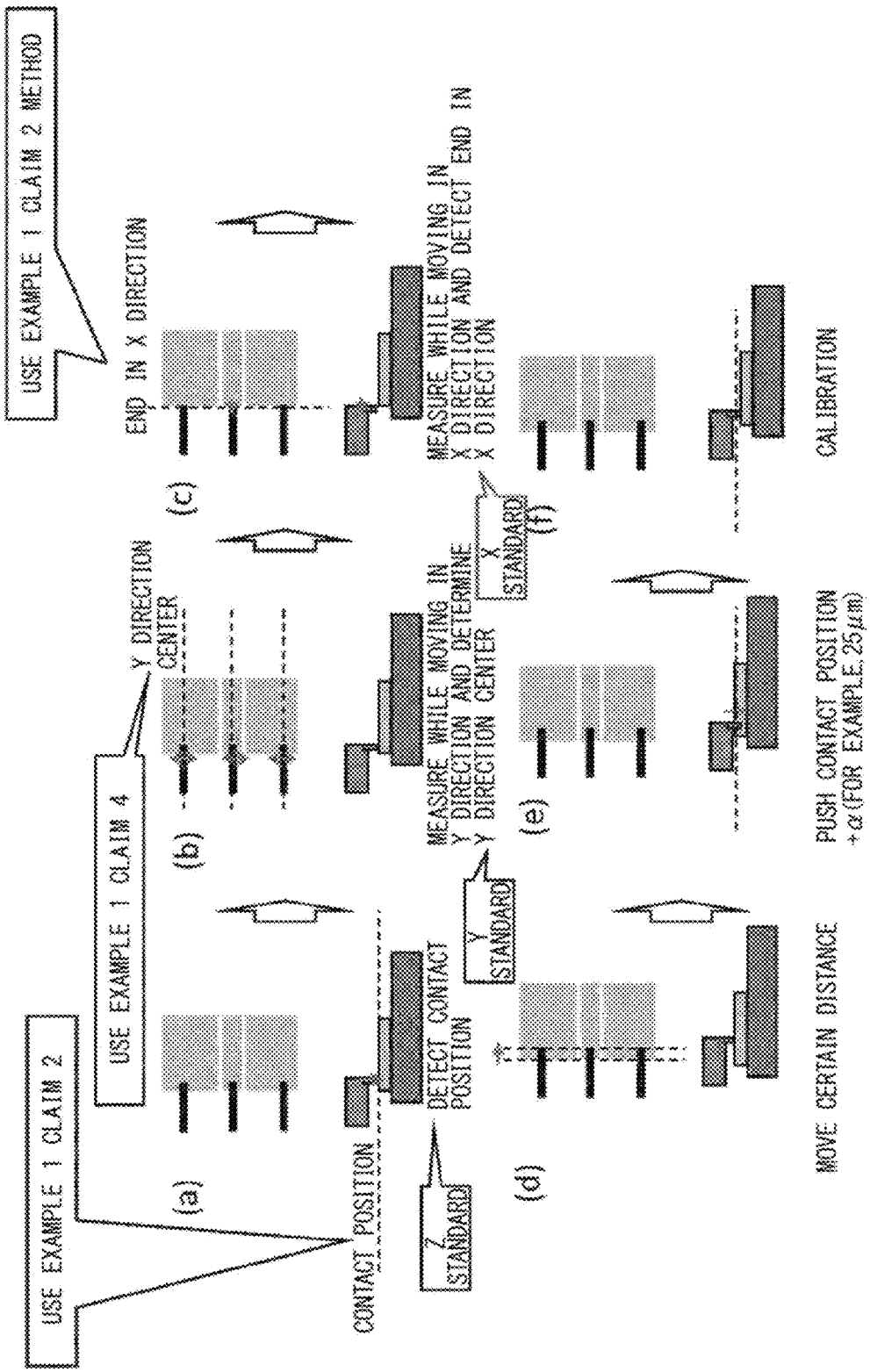
FIG. 15 is a process chart for explaining a method of determining the reference position of the Y axis and the X axis of Example 2.

FIG. 15 illustrates the procedure. First, a pair of probes (opposite probe is not illustrated in the drawing) is place on the THRU reference device and by a method of Example 1, the contact position is detected.

Thereafter, the center position in the Y direction is determined by the method of Example 1.

The contact position is detected while gradually shifting the position of the probe toward the outside of the reference device with respect to the X direction.

When reaching at the end of the reference device, since there is no electrode directly under the probe, the sharp change in the reflectivity coefficient is not recognized. For example, absolute values of the reflectivity coefficients $S_{11}$ and $S_{22}$ remain unchanged at almost one.

Therefore, with the end of the reference device, the reference position in the X direction can be determined.

In this manner, by applying Example 1, since it is possible to determine the probe reference position with the high reproducibility, it is possible to improve the calibration reproducibility.

Example 3

According to the present Example, by applying the determination method of the contact position in the Z direction described in Example 1 and by using the positioning pattern, the X, Y and Z coordinates can be determined with high accuracy.

Figure 16:
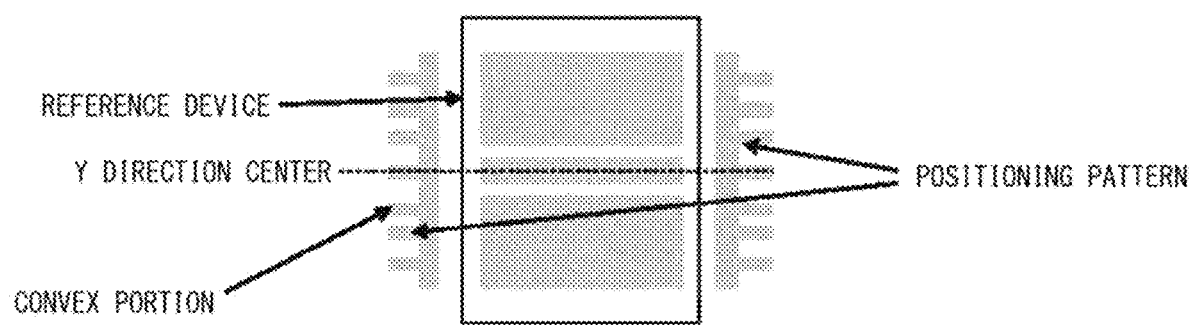
FIG. 16 is a drawing illustrating one example of a positioning pattern of Example 3.

The positioning pattern has the comb shape as illustrated in FIG. 16 and by using convex portions, X, Y and Z positions can be determined with high accuracy.

Figure 17:
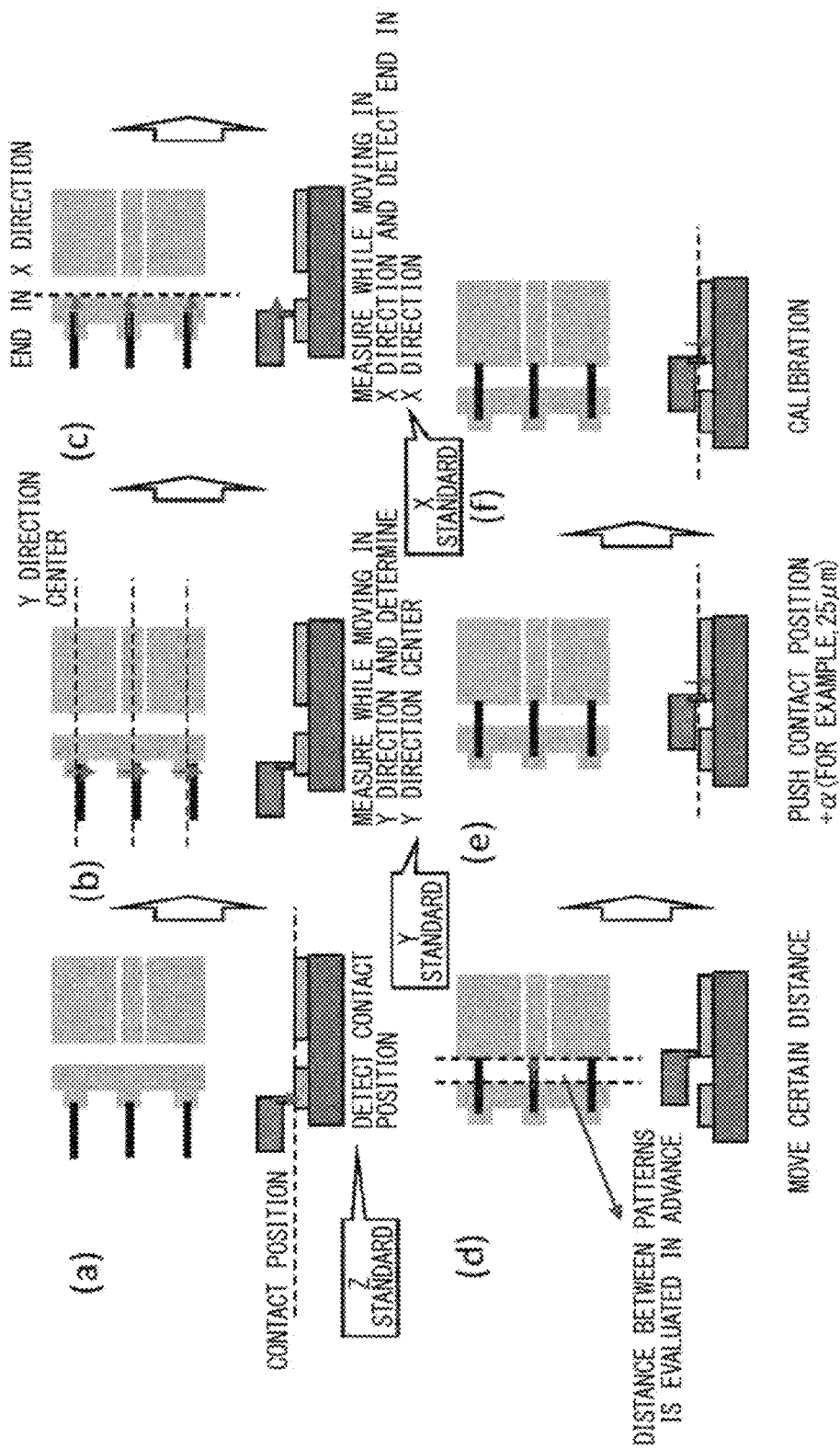
FIG. 17 is a process chart for explaining a method of determining the reference position of the Y axis and the X axis of Example 3.

FIG. 17 illustrates the procedure.

In the present Example, the positioning is possible by only using a single probe.

First, the probe is placed approximately above the convex portions of the positioning pattern and the contact position is detected by the method of Example 1.

Next, the contact position is detected while gradually shifting the position of the probe toward the outside of the pattern with respect to the Y direction.

When reaching the end of the patterns, since there is no electrode directly under the probe, the sharp change in the reflectivity coefficient is not recognized. For example, the absolute values of the reflectivity coefficient $S_{11}$ (or $S_{22}$) remain unchanged at approximately one.

Therefore, it is possible to determine the Y coordinate of the end of the patterns.

By conducting the similar operation in the opposite direction of the Y axis, since the Y coordinates of both ends of the convex portions of the patterns can be determined, the center coordinates can be defined as Y reference coordinates.

For the X direction as well, the contact detection is conducted while gradually shifting the position toward the outside of the pattern to detect the end of the patterns.

With the end, reference coordinates of the X direction can be defined.

In this manner, by applying Example 1, since the probe reference position can be determined with the high reproducibility, it is possible to enhance the calibration reproducibility.

Figure 18:
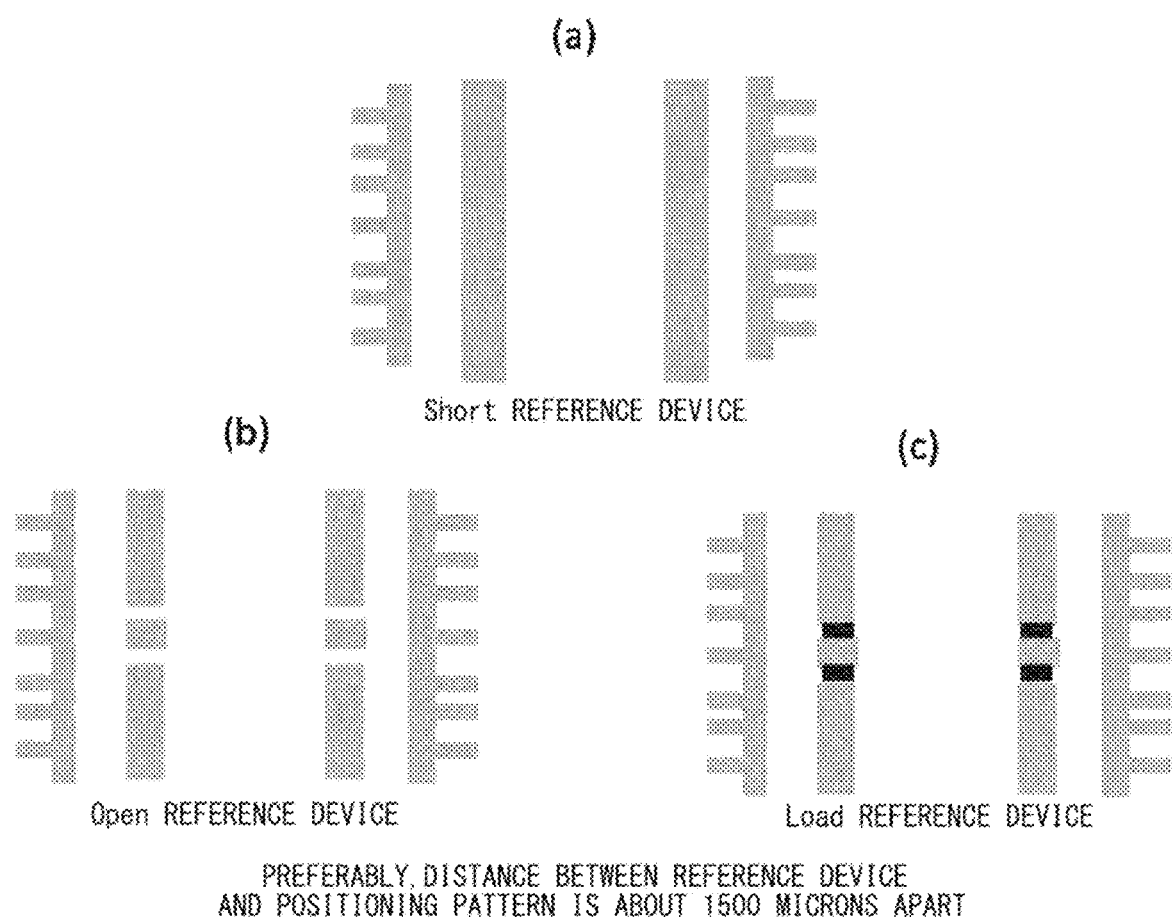
FIG. 18 is a drawing in which the positioning pattern of Example 3 is arranged to the THRU reference device, the SHORT reference device, and the LOAD reference device.

As illustrated in FIG. 16 and FIG. 18, the positioning pattern used in Example 3 has the comb shape and is used by causing the probe to directly contact with the patterns.

As represented in NPL 3, although the positioning pattern in the comb shape is already existed, these patterns are to be used as the marks, and it is not intended to use the probe in direct contact with the pattern.

Therefore, to avoid the contact between the probe and the pattern, the convex portions are absent at the center position of the Y direction of the patterns.

On the other hand, since it is premised that the positioning pattern used in the present example is directly contacted with the probe, as illustrated in FIG. 16, the convex portions are present at the center position in the Y direction.

The convex portions have the line symmetric structure with respect to the center axis in the Y direction so that all the tips of the GSG probe can be contacted and the convex portions are present at the position in contact with the ground (G) terminal of the probe.

All convex portions have the short-circuited structure.

Although the distance between the convex portions where the G portion contacts with the S portion needs to be changed depending on the pitch of the probe to be used, the distance is, for example, 100 μm, 150 μm, or about 250 μm.

Since it is needed to roughly arrange the probe immediately above the convex portions by the visual observation from the microscope, the size of each side of the convex portions of the probe needs to be 5 μm or more, and further, it is desirable that the size is 10 μm or more.

If the size of each side is smaller than the pitch of the probe, there is no problem in practical use, but if the size of each side is extremely large, since it is concerned that the side is electrically coupled with other patterns and affects the calibration result, it is desirable that the size is 50 μm or less.

Further, it is desirable that the distance between the reference device and the positioning pattern is separated by about 1500 μm.

Although the positioning pattern described above is described with the THRU reference device, the pattern can be used similarly together with the LOAD reference device, the SHORT reference device, and the OPEN reference device.

REFERENCE SIGNS LIST 1, 1a, 1b Probe (High-frequency probe)
2 Movable stage (sample stage, stage)
3 VNA (Measurement apparatus)
4 Frequency extension unit
5 Resistor 6 Stage controller
7 Control device
8 High-frequency characteristic inspection apparatus
9 THRU reference device
10 LOAD reference device
11 SHORT reference device
12 Signal region (Signal region)
13 Ground regions
14a, 14b Signal terminal (S)
15a, 15b, 15c, 15d Ground terminal (G)

The invention claimed is:

1. A high-frequency characteristic inspection apparatus including:
a pair of high-frequency probes that inspect an electrical characteristic of a plane circuit including a signal region and a ground region formed apart from each other by an S parameter obtained by pushing a tip against a surface of the plane circuit and discharging a high frequency;
a measurement apparatus;
a movable stage on which the plane circuit is mounted; and
a stage controller for controlling an operation of X, Y, and Z axes of the movable stage, wherein
each high-frequency probe includes a ground terminal that is in contact with the ground region at its tip and a signal terminal that is in contact with the signal region simultaneously with the ground terminal at its tip;
the pair of high-frequency probes are configured to contact with a surface of the plane circuit at the same time while facing each other at a certain interval;
a calibration of a reference position of the pair of high-frequency probes in the signal region of the plane circuit is conducted at an electrical midpoint determined based on a reflection/transmission characteristic and a phase characteristic of each S parameter measured by the measurement apparatus by each signal terminal of the pair of facing high-frequency probes contacting in the signal region and discharging the high frequency;
in the signal region of the plane circuit, when a longitudinal direction is an X axis direction, a lateral direction is a Y axis direction, and a vertical direction is a Z axis direction, the stage controller is controlled, the movable stage on which the plane circuit is mounted is operated in the Z axis direction, and each tip of the pair of facing high-frequency probes is caused to contact with the signal region;
a contact position (depth in Z axis direction) is determined based on a reflection characteristic of $S_{11}$, $S_{22}$ parameters measured by discharging the high frequency by contacting;
in a depth in a Z axis direction of the determined contact position, when a phase characteristic of $S_{11}$, $S_{22}$ parameters measured by discharging the high frequency in the signal region by each signal terminal of the pair of facing high-frequency probes is $\theta_{11}$, $\theta_{22}$ the stage controller is controlled, the movable stage on which the plane circuit is mounted is operated, and the pair of facing high-frequency probes are operated in the X axis direction; and
a reference position of an X axis of the pair of the high-frequency probe is determined such that $|\theta_{11}-\theta_{22}|$ measured by discharging the high frequency is an extreme value.

2. The high-frequency characteristic inspection apparatus according to claim 1, wherein
in the determined contact position (depth in Z axis direction) and a position of the X axis, when a phase characteristic of a $S_{12}$, $S_{21}$ parameters measured by discharging the high frequency in the signal region by each signal terminal of the pair of facing high-frequency probes is $\theta_{12}$, $\theta_{21}$;
the stage controller is controlled, the movable stage on which the plane circuit is mounted is operated, and the pair of facing high-frequency probes are moved in the Y axis direction;
a position of the Y axis is determined such that $\theta_{12} \times \theta_{21}$ measured by discharging the high frequency is an extreme value; and
a midpoint of the pair of facing high-frequency probe at the determined position of the Y axis is calibrated as a reference position of an electrical midpoint of a signal region of the plane circuit.

3. The high-frequency characteristic inspection apparatus according to claim 2, wherein the plane circuit is a THRU reference device.

4. A calibration method of a high-frequency characteristic inspection apparatus comprising:
calibrating a reference position of an electrical midpoint of a signal region of a plane circuit in the high-frequency characteristic inspection apparatus according to claim 3 including the stage controller and a control device for controlling the measurement apparatus.

5. A computer-readable non-transitory storage medium which stores a program that causes a computer to execute the calibration method according to claim 4.

6. A high-frequency characteristic inspection apparatus that includes
a pair of high-frequency probes that inspect an electrical characteristic of a plane circuit including a signal region and a ground region formed apart from each other by an S parameter obtained by pushing a tip against a surface of the plane circuit and discharging a high frequency and a measurement apparatus, wherein
each high-frequency probe includes a ground terminal that is in contact with the ground region at its tip and a signal terminal that is in contact with the signal region simultaneously with the ground terminal at its tip;
the pair of high-frequency probes are configured to contact with a surface of the plane circuit at the same time while facing each other at a certain interval;
a calibration of a reference position of the pair of high-frequency probes in the signal region of the plane circuit is conducted based on a reflection/transmission characteristic and a phase characteristic of each S parameter measured by the measurement apparatus by each signal terminal of the pair of facing high-frequency probes contacting in the signal region and discharging the high frequency;
the high-frequency characteristic inspection apparatus comprises a movable stage on which the plane circuit is mounted and a stage controller for controlling an operation of X, Y, and Z axes of the movable stage;
when in the signal region of the plane circuit, a longitudinal direction is an X axis direction, a lateral direction is a Y axis direction, and a vertical direction is a Z axis direction;
the stage controller is controlled, the movable stage on which the plane circuit is mounted is operated in the Z axis direction, and each tip of the pair of facing high-frequency probes is caused to contact with the signal region;

a contact position (depth in Z axis direction) is determined based on a reflection characteristic of $S_{11}$, $S_{22}$ parameters measured by discharging the high frequency by contacting;

when in the determined contact position (depth in Z axis direction), a phase characteristic of $S_{11}$, $S_{22}$ parameters measured by discharging the high frequency in the signal region by each signal terminal of the pair of facing high-frequency probes is $\theta_{12}$, $\theta_{21}$, the stage controller is controlled, the movable stage on which the plane circuit is mounted is operated, and the pair of facing high-frequency probes are moved in the Y axis direction;

a position of a Y axis is determined such that $\theta_{12} \times \theta_{21}$ measured by discharging the high frequency is an extreme value; and a midpoint of the pair of facing high-frequency probes at the determined position of the Y axis is determined as a reference position of an electrical midpoint of a signal region of the plane circuit.

7. The high-frequency characteristic inspection apparatus according to claim 6, wherein the stage controller is controlled, the movable stage on which the plane circuit is mounted is operated, and the pair of facing high-frequency probes are operated in the X axis direction; and at both ends in the X axis direction of the plane circuit determined based on the reflection characteristic of $S_{11}$, $S_{22}$ parameters measured by discharging the high frequency, a reference position of an X axis of the pair of the high-frequency probe is determined.

8. The high-frequency characteristic inspection apparatus according to claim 7, wherein the plane circuit is a THRU reference device.

9. A calibration method of a high-frequency characteristic inspection apparatus comprising:

calibrating a reference position of a signal region of a plane circuit in the high-frequency characteristic inspection apparatus according to claim 7 including the stage controller and a control device for controlling the measurement apparatus.

10. A computer-readable non-transitory storage medium which stores a program that causes a computer to execute the calibration method according to claim 9 in the high-frequency characteristic inspection apparatus.

11. The high-frequency characteristic inspection apparatus according to claim 6, wherein the plane circuit is a THRU reference device.

12. A calibration method of a high-frequency characteristic inspection apparatus comprising:

calibrating a reference position of a signal region of a plane circuit in the high-frequency characteristic inspection apparatus according to claim 6 including the stage controller and a control device for controlling the measurement apparatus.

13. A computer-readable non-transitory storage medium which stores a program that causes a computer to execute the calibration method according to claim 12 in the high-frequency characteristic inspection apparatus.

14. A high-frequency characteristic inspection apparatus that includes a pair of high-frequency probes that inspect an electrical characteristic of a plane circuit including a signal region and a ground region formed apart from each other by an S parameter obtained by pushing a tip against a surface of the plane circuit and discharging a high frequency and a measurement apparatus, wherein each high-frequency probe includes a ground terminal that is in contact with the ground region at its tip and a signal terminal that is in contact with the signal region simultaneously with the ground terminal at its tip;

the pair of high-frequency probes are configured to contact with a surface of the plane circuit at the same time;

a calibration of a reference position of the pair of high-frequency probes at the signal region of the plane circuit is conducted based on a reflection/transmission characteristic and a phase characteristic of each S parameter measured by the measurement apparatus by discharging the high frequency by contacting in the signal region by each signal terminal of the pair of high-frequency probes;

the high-frequency characteristic inspection apparatus comprises a movable stage on which the plane circuit is mounted and a stage controller for controlling an operation of X, Y, and Z axes of the movable stage;

when in the signal region of the plane circuit, a longitudinal direction is an X axis direction, a lateral direction is a Y axis direction, and a vertical direction is a Z axis direction; a positioning pattern in a comb shape that includes the same height as the plane circuit in the Z axis direction and faces parallel to a longitudinal direction at a certain interval is placed on the movable stage;

the positioning pattern in the comb shape includes, at a center position in a Y direction (a longitudinal direction of the positioning pattern), a convex portion (comb teeth) that is perpendicular to the Y direction and projects in an X direction, a structure line symmetrical to a central axis in the Y direction, and at a position corresponding to a ground (G) terminal of the pair of high-frequency probes, a convex portions; the convex portions are all short-circuited; the stage controller is controlled, the movable stage on which the plane circuit is mounted is operated in a Z axis direction, and each tip of the pair of high-frequency probes is caused to contact with the positioning pattern;

a contact position (depth in Z axis direction) is determined based on a reflection characteristic of an $S_{11}$ parameter measured by discharging the high frequency and contacting;

the stage controller is controlled, the movable stage on which the plane circuit is mounted is operated, and the pair of high-frequency probes is operated in a Y axis direction; a reference position of a Y axis of the pair of high-frequency probes is determined at a midpoint of both ends in a Y axis direction of the positioning pattern estimated by discharging the high frequency; next, the stage controller is controlled, the movable stage on which the plane circuit is mounted is operated, and the pair of high-frequency probes is operated in an X axis direction; at one end of an X axis direction of the positioning pattern determined based on the reflection characteristic of an $S_{11}$ parameter measured by discharging the high frequency, a reference position of an X axis of the pair of high-frequency probes is determined; and a calibration is conducted at a reference position of the plane circuit that is moved in parallel the certain distance from the determined contact position and a reference position of the X axis and the Y axis.

15. A THRU reference device, a LOAD reference device, a SHORT reference device, or an OPEN reference device, wherein the high-frequency characteristic inspection apparatus according to claim 14 includes the positioning pattern in the comb shape.

16. The high-frequency characteristic inspection apparatus according to claim 14, wherein the plane circuit is a THRU reference device.

17. A calibration method of a high-frequency characteristic inspection apparatus comprising:
    calibrating a reference position of a signal region of a plane circuit in the high-frequency characteristic inspection apparatus according to claim 14 including the stage controller and a control device for controlling the measurement apparatus.

18. A computer-readable non-transitory storage medium which stores a program that causes a computer to execute the calibration method according to claim 17 in the high-frequency characteristic inspection apparatus.

* * * * *